(12) United States Patent
Hirler et al.

(10) Patent No.: US 9,117,874 B2
(45) Date of Patent: Aug. 25, 2015

(54) METHOD FOR FABRICATING A TRENCH STRUCTURE, AND A SEMICONDUCTOR ARRANGEMENT COMPRISING A TRENCH STRUCTURE

(71) Applicant: Infineon Technologies Austria AG, Villach (AT)

(72) Inventors: Franz Hirler, Isen (DE); Thoralf Kautzsch, Dresden (DE); Anton Mauder, Kolbermoor (DE); Michael Rueb, Faak am See (AT); Hans-Joachim Schulze, Taufkirchen (DE); Helmut Strack, Munich (DE); Armin Willmeroth, Augsburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/084,166

(22) Filed: Nov. 19, 2013

(65) Prior Publication Data
US 2014/0073110 A1 Mar. 13, 2014

Related U.S. Application Data

(63) Continuation of application No. 11/834,154, filed on Aug. 6, 2007, now abandoned.

(30) Foreign Application Priority Data

Aug. 10, 2006 (DE) .......................... 10 2006 037 510

(51) Int. Cl.
*H01L 21/76* (2006.01)
*H01L 21/762* (2006.01)
*H01L 21/324* (2006.01)
*H01L 29/06* (2006.01)
*H01L 29/40* (2006.01)
*H01L 29/66* (2006.01)
*H01L 29/78* (2006.01)

(52) U.S. Cl.
CPC ...... *H01L 21/76224* (2013.01); *H01L 21/3247* (2013.01); *H01L 29/0653* (2013.01); *H01L 29/407* (2013.01); *H01L 29/66621* (2013.01); *H01L 29/7803* (2013.01); *H01L 29/7804* (2013.01)

(58) Field of Classification Search
CPC .................................................. H01L 21/76224
USPC .......................................................... 438/424
See application file for complete search history.

(56) References Cited

U.S. PATENT DOCUMENTS 7,157,378 B2 1/2007 Brask et al.
2007/0243692 A1 10/2007 Rudeck et al.
2008/0230916 A1 9/2008 Saito et al.

FOREIGN PATENT DOCUMENTS

DE 102005039331 2/2007

OTHER PUBLICATIONS

Office Action mailed May 21, 2009 in U.S. Appl. No. 11/834,154.

*Primary Examiner* — David S Blum
(74) *Attorney, Agent, or Firm* — Dicke, Billig & Czaja, PLLC

(57) ABSTRACT

A semiconductor device, in which a first trench section is produced proceeding from a surface of a semiconductor body into the semiconductor body. A semiconductor layer is produced above the surface and above the first trench section. A further trench section is produced in the semiconductor layer in such a way that the first trench section and the further trench section form a continuous trench structure.

26 Claims, 5 Drawing Sheets

METHOD FOR FABRICATING A TRENCH STRUCTURE, AND A SEMICONDUCTOR ARRANGEMENT COMPRISING A TRENCH STRUCTURE

CROSS-REFERENCE TO RELATED APPLICATIONS

This Utility patent application is a continuation application of U.S. Ser. No. 11/834,154 filed Aug. 6, 2007 and claims priority to German Application No. 10 2006 037 510.6, filed Aug. 10, 2006, which are both herein incorporated by reference.

BACKGROUND

The present disclosure relates to a method for fabricating a trench structure, and to a semiconductor arrangement including a trench structure.

Trench structures, also known as trenches, principally find application in semiconductor technology for isolating integrated components and storage capacitors in dynamic memories (DRAMs). However special applications are also known for power semiconductor components, such as e.g., for a Trench Extended Drain Region Filed-effect Transistor (TEDFET). The construction of a TEDFET is described in the published patent application DE 10 2005 039 331.

In this case, the trend is towards ever narrower and at the same time deeper trench structures. One important measure of this is the aspect ratio, that is to say the ratio of depth to width of the trench.

Trench structures are generally produced by anisotropic etching processes, in particular by dry etching processes. Trench structures having an aspect ratio of 80:1 can be fabricated thereby at the present time.

For these and other reasons there is a need for the present invention.

SUMMARY

Embodiments of the present invention provide a method for fabricating a trench structure having a high aspect ratio and a semiconductor arrangement including a deep trench structure. The method according to one embodiment of the invention includes producing a first trench section proceeding from a surface of a semiconductor body into the semiconductor body, producing a semiconductor layer above the surface and above the first trench section, and producing a further trench section in the semiconductor layer in such a way that the first trench section and the further trench section form a continuous trench structure.

The step-by-step construction of the trench structure from individual trench sections in the semiconductor arrangement makes it possible to produce the ultimately desired trench structure with an aspect ratio that has not been achieved heretofore by virtue of the composition of the individual trench sections.

The semiconductor arrangement according to exemplary embodiments of the invention has a trench structure, wherein the trench structure is composed of a plurality of vertical trench sections and at least one lateral connecting element. The lateral connecting element serves to compensate for a possibly occurring offset between vertical trench sections arranged one above another, and to connect the offset vertical trench sections to one another. This gives rise to a continuous trench structure without interruption.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
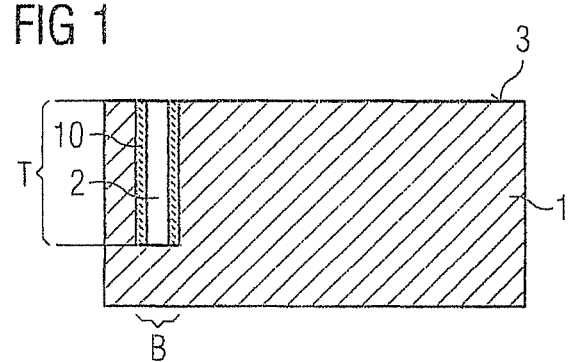
FIG. 1 to FIG. 5 illustrate schematic cross-sectional views of individual method results of an exemplary embodiment of the method according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is pointed out that identical elements in the figures are provided with the same or similar reference symbols, and that a repeated description of the elements is omitted.

The described method for fabricating a trench structure can be used for example for fabricating a trench structure in a TEDFET. TEDFET (Trench Extended Drain Region Field-effect transistors) are distinguished by the fact that a deep and very thin dielectric layer is required between a drift zone and a drift control zone. The dielectric layer can be fabricated by the method according to the invention.

That region of the dielectric layer which separates the drift zone and the drift control zone is also referred to as "accumulation dielectric". In the case of a TEDFET the terms "drift zone" or "drift path" denote a semiconductor region in which a reverse voltage is reduced upon application of the reverse voltage to the component, that is to say in which a space charge zone propagates as the reverse voltage increases.

The doping of the drift control zone is chosen such that the latter has at least one semiconductor section which can be fully depleted in a direction perpendicular to the accumulating dielectric. This is tantamount to the fact that the dopant atoms present in the semiconductor section can be fully ionized when an electric field is present in a direction perpendicular to the accumulation dielectric, without an avalanche breakdown occurring. This can be achieved by virtue of the fact that a quotient of a net dopant charge in a semiconductor section adjoining the trench structure and the drift zone and the area of the trench structure arranged between the drift control zone and the drift zone is less than the breakdown charge of the drift control zone, which lies within a range of approximately $1 \cdot 10^{12}/cm^2$ to approximately $2 \cdot 10^{12}/cm^2$.

When the component is driven in the on state, the drift control zone serves for controlling an accumulation channel, i.e. a region having locally greatly increased charge carrier density, in the drift zone along the accumulation dielectric. A potential difference between the drift control zone and the drift zone is required for forming the channel. In this case, the type of charge carriers, that is to say electrons or holes, which accumulate along the accumulation dielectric is dependent on the polarity of the potential difference, but not on the basic doping of the drift zone, which can also be realized as an undoped or intrinsic zone.

The presence of such an accumulation channel leads to a considerable reduction of the on resistance of the power semiconductor component in comparison with components which do not have such a drift control zone. For the same on resistance, it is possible to reduce the basic doping of the drift zone of the TEDFET in comparison with the basic doping of the drift zone of conventional components, which results in a higher dielectric strength of the TEDFET in comparison with conventional components.

The drift zone is capacitively coupled to the drift control zone via the accumulation dielectric, whereby the accumulation channel can be formed when the component is driven in the on state. This capacitive coupling and the compliance with the above-specified doping condition for the drift control zone have the effect that in the case of components in the off state, that is to say when a space charge zone propagates in the drift zone, a space charge zone likewise propagates in the drift control zone. This space charge zone propagating in the drift control zone has the effect that the potential profile in the drift control zone follows the potential profile in the drift zone. A potential difference or an electrical voltage between the drift zone and the drift control zone is thereby limited. This voltage limiting makes it possible to use a thin accumulation dielectric, which entails the advantage of an improved capacitive coupling between the drift control zone and the drift zone.

In this case, the desired width of the trench structure and therefore of each individual trench section is proportioned to the static voltage difference between drift zone and drift control zone that is present during operation of the TEDFET.

FIG. 1 illustrates a first intermediate state of the method of a first exemplary embodiment of the invention.

In this first exemplary embodiment of the method according to the invention for fabricating a trench structure, a first process involves producing a first trench section 2 from a surface 3 of a semiconductor body 1 into the semiconductor body.

For this purpose, firstly a mask layer (e.g., a hard mask—not illustrated in FIG. 1) is applied on the surface 3 of the semiconductor body and patterned. Afterwards, the first trench section 2 is etched (trench etch) and passivated with an oxide layer 10 on the sidewalls. This is done with the aid of the spacer technique, in which firstly the entire surface is coated with an oxide layer 10 and the oxide layer 10 is subsequently removed again on the surface 3 and at the bottom of the trench by using an anisotropic etch, such that the oxide layer 10 remains only on the side walls of the trench section 2. Instead of the oxide, it is also possible, in principle, to use other insulator layers such as $Si_3N_4$ or layer stacks of a plurality of insulator materials. In contrast to the illustration in FIG. 1, the trench can also be completely filled with a dielectric which is homogeneous or constructed in layered fashion and which can remain in the trench.

The first trench section 2 is produced with an approximately uniform width B within the range of 30-150 nm. The depth T of the trench section 2 results from the width B chosen and the available etching technology. Given an at the present time maximum possible aspect ratio of approximately 80:1, therefore, the maximum achievable depth of the trench section 2 is 12 µm if the width B is chosen at 150 nm. A depth T of approximately 1-6 µm is normally striven for.

The alignment of the first trench section 2 is achieved by using specifically dimensioned alignment structures in a semiconductor region not required for the electrical function of the semiconductor component—e.g., in a scribing frame (not illustrated in FIG. 1). While the trenches are intended to be overgrown during the subsequent deposition of the next semiconductor layer as far as possible without conspicuous features such as e.g., processes or depressions, it is in the nature of the alignment structures that they must still be identified after the deposition process, which can be realized e.g., by using a trench structure that is at least as wide as the width B of the trenches in the active semiconductor region. As an alternative, the alignment structures can also be applied on or introduced into the rear side of the semiconductor wafer, whereby they are protected against depositions on the front side of the wafer.

Figure 2:
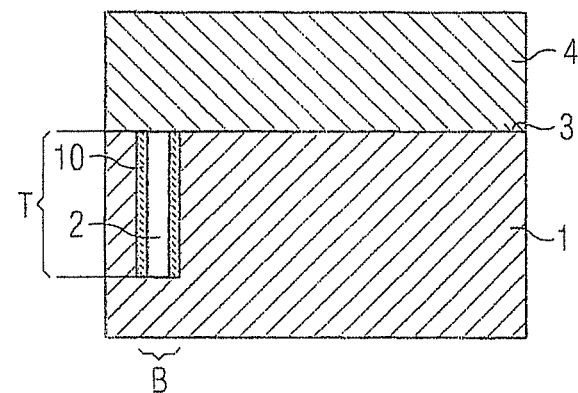

FIG. 2 illustrates a semiconductor layer 4 that was produced above the surface 3 and above the first trench section 2.

The semiconductor layer 4 is produced epitaxially and with a high deposition rate. By using this non-conformable process, the trench section 2 is completely buried, that is to say that semiconductor layer 4 grows over the trench section 2 and bridges the latter.

The semiconductor layer 4 grows in monocrystalline fashion from the same semiconductor material as the semiconductor body 1 and, in view of the trench dimensioning, becomes thinner than the maximum achievable trench depth, that is to say is normally deposited up to a thickness of approximately 1-6 µm.

Figure 3:
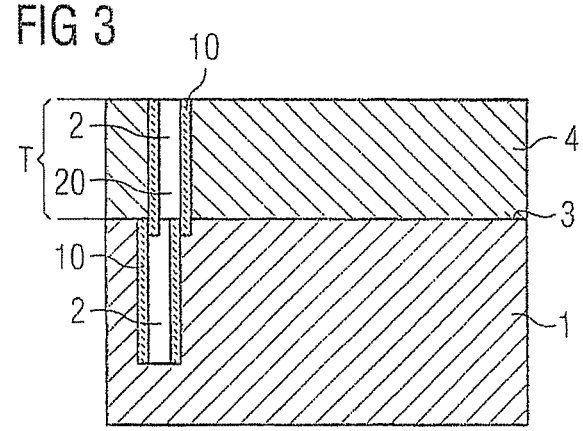

FIG. 3 illustrates a further trench section 2 in the semiconductor layer 4. The further trench section 2 in the semiconductor layer 4 was produced in such a way that the first trench section 2 and the further trench section 2 form a continuous trench structure 20.

The further trench section 2 in the semiconductor layer 4 is likewise produced by using a trench etch with the aid of a mask produced on the surface of the semiconductor layer 4. The further trench section 2 produced is likewise passivated with an oxide layer 10 on the side walls with the aid of the spacer technique. The oxide layer 10 is produced by thermal oxidation. As a result, the thicknesses of oxide layers already present in other trench sections increase to a lesser extent. The dimensioning of the further trench section 2 is oriented towards the dimensioning of the first trench section 2.

In this first exemplary embodiment of the invention, the further trench section 2 should be positioned as precisely as possible above the first trench section 2. The alignment of the further trench section 2 is likewise effected by using the specifically dimensioned alignment structures in the scribing frame. A misalignment of the two trench sections 2 with respect to one another will result, however, under productive conditions.

The following arises as a condition for a maximum permitted misalignment in the first exemplary embodiment of the invention:

misalignment<trench section width in the underlying plane.

Trench sections 2 lying one above another should therefore at least partly overlap. Thus, e.g., given a trench section width B of approximately 100 nm, a misalignment of approximately 50 nm would still be tolerable.

Figure 4:
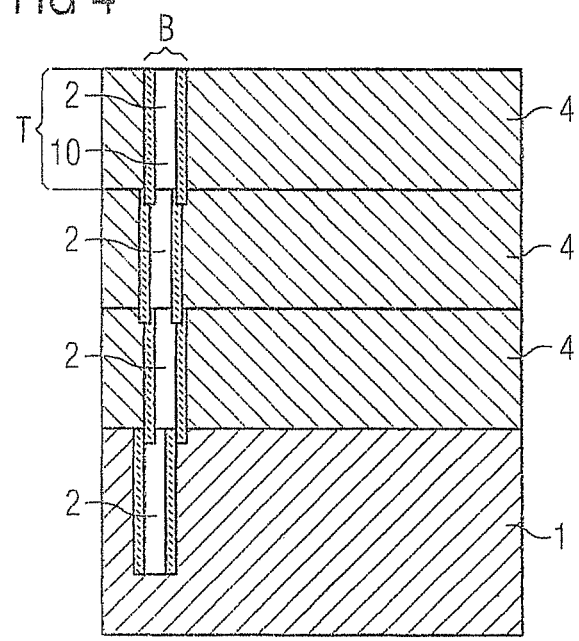

FIG. 4 illustrates further semiconductor layers 4 with further trench sections 2, which are formed by repeating the processes producing a semiconductor layer 4 above the surface 3 and above the first trench section 2, and producing a further trench section 2 in the semiconductor layer 4 in such a way that the first trench section 2 and the further trench section 2 form a continuous trench structure 20, until the trench structure 20 has reached a desired depth T'.

The depth T' of the trench structure is formed with at least 10 μm. The same conditions as explained in the method processes concerning FIG. 2 and FIG. 3 hold true for the method implementation of these further processes.

Figure 5:
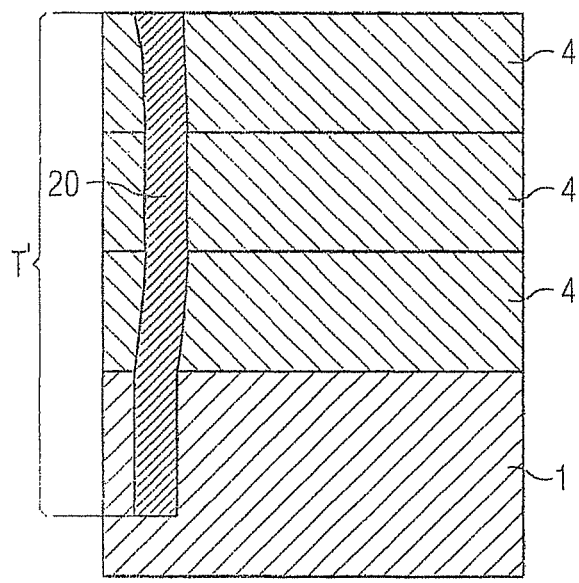

As illustrated in FIG. 5, for the ultimately desired trench structure 20 in this first exemplary embodiment of the invention, the oxide layers 10 are stripped from the sidewalls of the trench sections 2 and processes thus possibly formed between two trench sections 2 are smoothed by using a $H_2$ heat treatment. In this case, $H_2$ gas is introduced into the trench structure 20 at a temperature within the range of 800-900° C. and with a heat treatment time within the range of 2-15 minutes.

Afterwards, the trench structure 20 is at least partly filled with a filling material. Depending on the application, dielectric, in particular high-k material, is at least partly used as filling material. High-k materials are dielectrics having a higher relative permittivity $\epsilon_r$ than conventional $SiO_2$ ($\epsilon_r=3.9$) or oxynitrides ($\epsilon_r<6$) or $Si_3N_4$ ($\epsilon_r\approx6.9$). A combination of thermally produced $SiO_2$ directly on the semiconductor surface followed by a further dielectric layer, e.g., a high-k material, is.

The above-described etching out of lateral dielectric layers, the smoothing of processes and the filling with a new homogeneous or layered dielectric are optional process processes.

Figure 6:
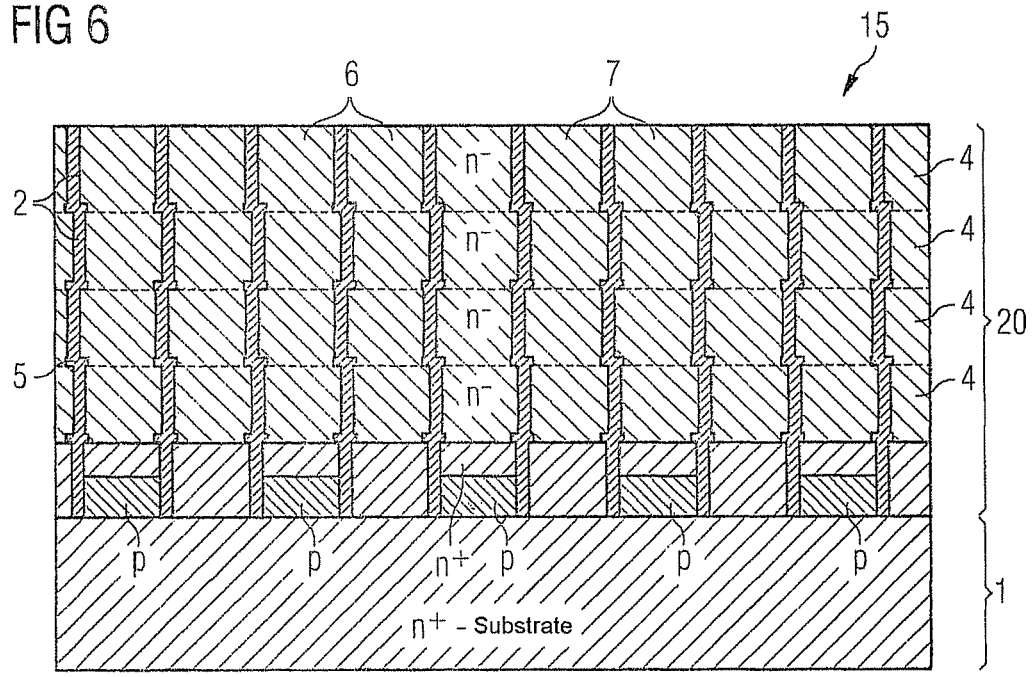
FIG. 6 illustrates a schematic cross-sectional view of an exemplary embodiment of the semiconductor arrangement according to the invention.

FIG. 6 illustrates an exemplary embodiment of the semiconductor arrangement according to the invention.

An epitaxial layer is arranged on an n'-type substrate, the epitaxial layer together with the n'-type substrate forming a semiconductor body 1. A plurality of vertical trench sections 2 are arranged in the semiconductor body, the trench sections being spaced apart laterally from one another and extending into the semiconductor body 1.

A plurality of semiconductor layers 4 lying one above another are arranged on the semiconductor body 1, a plurality of vertical trench sections 2 in turn being arranged in each semiconductor layer 4.

The semiconductor layers 4 are layers grown epitaxially, for example. The vertical trench sections 2 extend in each case through the respective semiconductor layer 4. Lateral connecting elements 5 are arranged between in each case two semiconductor layers 4 lying one on top of another, and between the first semiconductor layer 4 and the semiconductor body 1, the connecting elements connecting in each case two closest vertical trench sections 2 from different semiconductor layers. The closest trench sections 2 from different semiconductor layers are slightly offset laterally in this case. The offset or an only partial overlap can stem e.g., from a misalignment of the planes with respect to one another. The connecting elements 5 bridge the offset. Consequently, the trench structure 20 formed in this way extends in continuous form through all the semiconductor layers 4 right into the semiconductor body 1 as a narrow and deep trench structure 20. The trench structure 20 is therefore composed of a plurality of vertical trench sections 2 and at least one lateral connecting element 5, wherein the vertical trench sections 2 and the at least one lateral connecting element 5 are formed identically in type. However, applications can also occur in which the vertical trench sections 2 and the at least one lateral connecting element are formed differently.

The illustrated semiconductor arrangement 15 of the exemplary embodiment is part of TEDFET having a drift zone 6 and a drift control zone 7, which are separated from one another by a narrow dielectric layer. In the exemplary embodiment illustrated, the dielectric layer is formed by the trench structure 20 filled with a dielectric. The drift control zone 7 has, at the junction of the n'-type substrate used as drain terminal, that is to say here at the end of the trench structure 20, an opposite doping to the semiconductor body 1 and semiconductor layer 4. It is a $p^+$-type zone in the exemplary embodiment illustrated.

FIG. 6 illustrates only part of the TEDFET, but not the cell structure with source, body and gate. In particular planar and also trench MOS cells are suitable for the cell structure.

The trench structure in the semiconductor arrangement as illustrated in FIG. 6 can be fabricated by the fabrication method according to the invention as explained by way of example in FIGS. 1 to 5. Lateral layers are produced between the individual epitaxy processes for the fabrication of the semiconductor layers 4, the layers in each case being patterned in such a way that connecting elements 5 are formed, which connect two laterally spaced-apart trench sections 2 laying one over another to one another.

In the exemplary embodiment of FIG. 6, the connecting elements 5 are formed from a dielectric layer, and in terms of the thickness and composition are for example identical to the final thickness and composition of the dielectric in the entire trench structure 20.

After the patterning of the lateral connecting element 5, a new semiconductor layer 4 is deposited epitaxially, a selective growth being chosen at the beginning of the deposition in order that the lateral dielectric layers are epitaxially overgrown laterally. Faster deposition conditions can subsequently be chosen.

A suitable dielectric is $SiO_2$ or else, in particular, layer stacks including $SiO_2$ and $Si_3N_4$ and oxynitrides, in order to minimize thermomechanical stress with respect to the silicon semiconductor material of the semiconductor body 1 and with respect to the semiconductor layers 4. Dielectrics having medium and/or high k values are likewise suitable.

Figure 7:
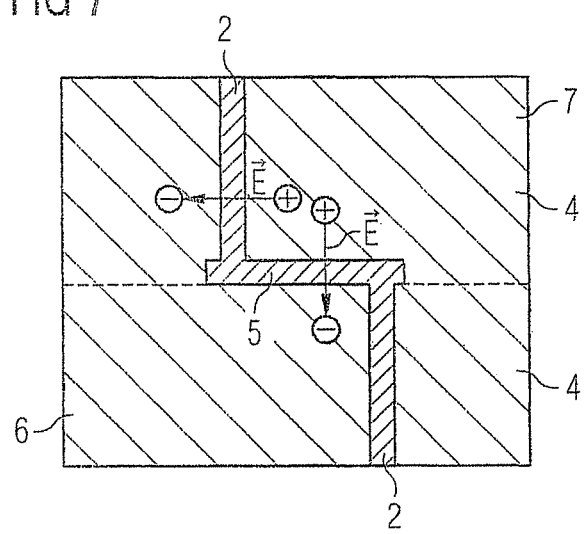
FIG. 7 illustrates a schematic detail view A from FIG. 6 in a first embodiment of the semiconductor arrangement according to the invention.

FIG. 7 illustrates a detail excerpt A from FIG. 6. A drift zone 6 with the adjacent drift zone 7 of a TEDFET is illustrated at the junction between two successive epitaxial semiconductor layers 4. The drift zone 6 and the drift control zone 7 are separated from one another by a dielectric layer. The dielectric layer is formed by the vertical trench sections 2 filled with dielectric and the lateral connecting elements 5 composed of the same dielectric. The desired accumulation of charge carriers in the drift zone 6 and the drift control zone 7 during operation of a TEDFET takes place not only along the vertical trench sections 2 but also along the lateral connecting elements 5. As a result, an increase in the on resistance remains limited even as a result of the stepped course of the dielectric.

Figure 8:
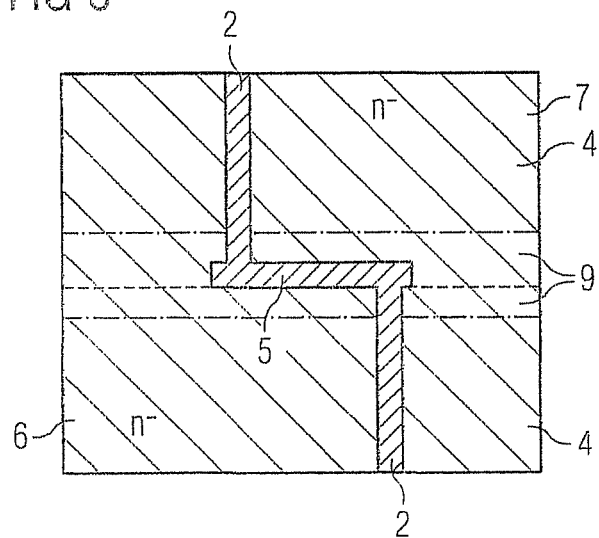
FIG. 8 illustrates a schematic detail view A from FIG. 6 in a further embodiment of the semiconductor arrangement according to the invention.

FIG. 8 illustrates the detail excerpt A in a further embodiment of the TEDFET, an additional n-type doping 9 being implanted into the top side of the lower n-doped semiconductor layer 4. By using subsequent thermal processes, the dopant is also out diffused into the adjacent n-doped semiconductor layer 4. The additional n-type doping reduces the additional current resistance component specifically at the ends of the lateral connecting element 5, at which, due to the dictates of geometry, there is the greatest level of distance with respect to the controlling charge of the drift control zone 7.

Figure 9:
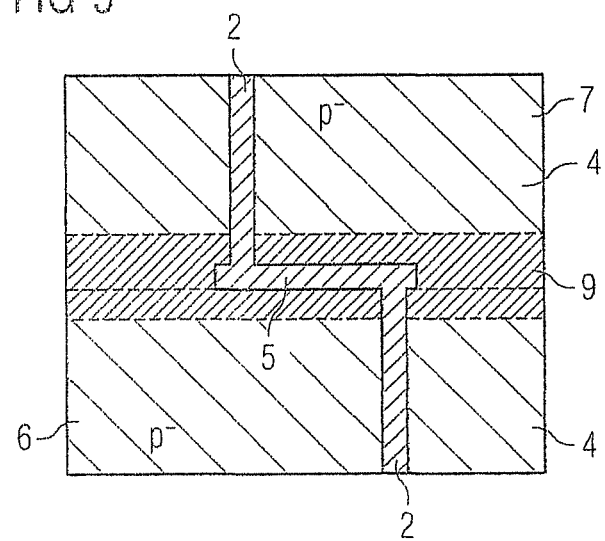
FIG. 9 illustrates a schematic detail view A from FIG. 6 in a further embodiment of the semiconductor arrangement according to the invention.

FIG. 9 illustrates a further embodiment of the TEDFET, in which the semiconductor layers 4 are fabricated as p-doped layers. At the junction between two semiconductor layers 4, once again by using an n-type dopant implantation with subsequent out diffusion, an n-type doping 9 is formed at the ends of the lateral connecting element 5 for the purpose of reducing the current resistance component.

The p-type doping of the semiconductor layers 4 leads, in the drift zone 6, to an electron inversion channel without any significant influence on the on resistance.

Figure 10:
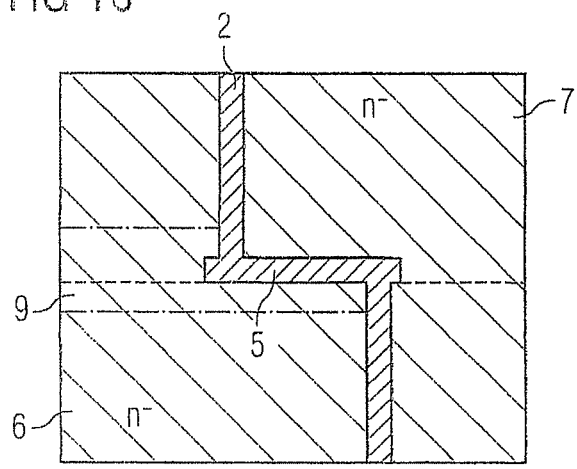
FIG. 10 illustrates a schematic detail view A from FIG. 6 in a further embodiment of the semiconductor arrangement according to the invention.

FIG. 10 illustrates a further embodiment of the TEDFET, which involves the introduction of an additional n-type doping 9 in p-type doping of the semiconductor layer 4 only in the region of the drift zone 6. As a result, a breakdown of the component occurs firstly in the drift zone 6. The drift control zone 7 therefore has a higher blocking capability, which has a favourable effect on the avalanche behaviour.

The lateral extent of the additional n-type doping 9 can be varied in this case, such that, by way of example, the doping reaches as far as the closest vertical trench section 2. Particularly if the n-type doping 9 is introduced before the formation of the lateral connecting element 5 e.g., by ion implantation of phosphorus, the closet vertical trench section 2 constitutes a barrier, such that the diffusion is braked there (not illustrated in FIG. 10-cf. FIG. 11).

Figure 11:
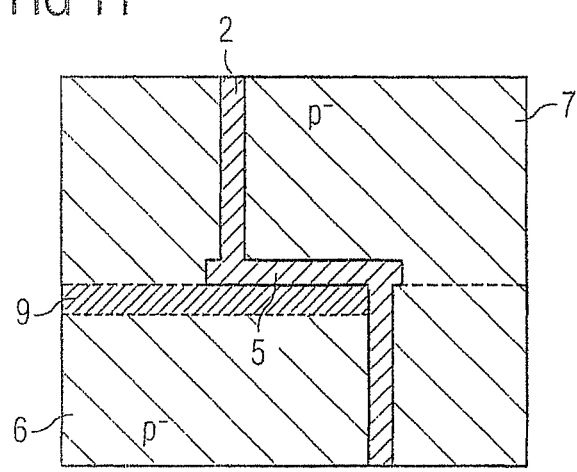
FIG. 11 illustrates a schematic detail view A from FIG. 6 in a further embodiment of the semiconductor arrangement according to the invention.

FIG. 11 illustrates a further embodiment of a TEDFET, in which an n-type doping 9 is introduced only locally into the drift zone 6 of a p-doped semiconductor layer 4. By way of example, the n-type doping 9 reaches laterally as far as the closest vertical trench section 2. This local introduction of n-type doping 9 into the drift zone 6 enables a reduction of the net p-type doping in the adjoining drift control zone 7.

All the above-mentioned exemplary embodiments and embodiments are not intended to be understood as final examples for the method according to the invention and the semiconductor arrangement according to the invention, but rather are intended merely to elucidate the invention by way of example.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating a semiconductor device comprising:
    a) producing a first trench section proceeding from a surface of a semiconductor body into the semiconductor body;
    b) producing a semiconductor layer above the surface and above the first trench section;
    c) producing a further trench section in the semiconductor layer in such a way that the first trench section and the further trench section form a non-filled continuous trench structure; and
    d) forming an insulation layer only on side walls of the further trench section.

2. The method of claim 1, comprising:
    d) repeating steps b) and c) until the trench structure has reached a desired depth T'.

3. The method of claim 1, wherein the semiconductor layer is produced epitaxially.

4. The method of claim 1, wherein the semiconductor layer is produced with a thickness of between 1 µm and 12 µm, in particular between 1 µm and 6 µm.

5. The method of claim 1, wherein the trench structure is formed with a depth T' of at least 10 µm.

6. The method of claim 1, wherein the semiconductor layer is produced from the same semiconductor material as the semiconductor body.

7. The method of claim 1, wherein the semiconductor layer is doped during or after production.

8. The method of claim 7, wherein the doping is varied in a lateral and/or vertical direction.

9. The method of claim 1, wherein each trench section is produced with a uniform width B.

10. The method of claim 1, wherein the trench sections are in each case produced by an etch.

11. The method of claim 1, wherein each trench section is at least partly filled with filling material only after forming the non-filled continuous trench structure.

12. The method of claim 11, wherein a dielectric is at least partly used as filling material.

13. The method of claim 12, wherein a high-k material is at least partly used as dielectric.

14. The method of claim 1, wherein trench sections lying one above another at least partly overlap.

15. The method of claim 1, wherein, before producing the semiconductor layer, a layer is produced parallel to the surface of the semiconductor body and patterned in such a way that a connecting element is formed, which connects two trench sections lying one above another to one another.

16. The method of claim 1, wherein, before producing the semiconductor layer, a layer is produced parallel to the surface of the semiconductor body and patterned in such a way that a connecting element is formed, which connects two laterally spaced-apart trench sections lying one above another to one another.

17. The method of claim 15, wherein the layer is produced with a thickness equal to the width of the trench sections.

18. The method of claim 15, wherein the connecting element is configured like the trench sections to be connected.

19. The method of claim 15, wherein the semiconductor layer is produced by selective growth at least at the beginning of production.

20. The method of claim 1, wherein the semiconductor device is a TEDFET.

21. A method for fabricating a semiconductor device comprising:

producing a first trench section proceeding from a surface of a semiconductor body into the semiconductor body;

producing a semiconductor layer above the surface and above the first trench section;

producing a further trench section in the semiconductor layer in such a way that the first trench section and the further trench section form a non-filled continuous trench structure; and forming a dielectric layer on only side walls of the further trench section.

22. The method of claim 21, comprising:

aligning the first trench section with the further trench section.

23. A method for fabricating a semiconductor device comprising:

producing a first trench section proceeding from a surface of a semiconductor body into the semiconductor body;

forming a first insulation layer only on side walls of the first trench section;

producing a semiconductor layer above the surface and above the first trench section;

producing a further trench section in the semiconductor layer in such a way that the first trench section and the further trench section form a non-filled continuous trench structure; and forming a further insulation layer only on side walls of the further trench section.

24. The method of claim 23, wherein forming the further insulation layer includes forming an oxide layer with the aid of a spacer technique.

25. The method of claim 23, including producing the further insulation layer by thermal oxidation.

26. The method of claim 23, comprising:

aligning the first trench section with the further trench section.

* * * * *